(12) United States Patent
Aakjer

(10) Patent No.: US 7,839,707 B2
(45) Date of Patent: Nov. 23, 2010

(54) FUSES FOR MEMORY REPAIR

(75) Inventor: Thomas Aakjer, Roskilde (DK)

(73) Assignee: Vitesse Semiconductor Corporation, Camarillo, CA (US)

( * ) Notice: Subject to any disclaimer, the term of this patent is extended or adjusted under 35 U.S.C. 154(b) by 129 days.

(21) Appl. No.: 12/207,321

(22) Filed: Sep. 9, 2008

(65) Prior Publication Data
US 2010/0061168 A1  Mar. 11, 2010

(51) Int. Cl.
G11C 29/00 (2006.01)

(52) U.S. Cl. .................. 365/200; 365/225.7

(58) Field of Classification Search .............. 365/200, 365/225.7
See application file for complete search history.

(56) References Cited

U.S. PATENT DOCUMENTS

| | | | |
|---|---|---|---|
| 3,753,244 A | 8/1973 | Sumilas et al. | |
| 4,389,715 A | 6/1983 | Eaton, Jr. et al. | |
| 6,426,903 B1 * | 7/2002 | Clevenger et al. | 365/200 |
| 6,542,418 B2 * | 4/2003 | Braceras et al. | 365/200 |
| 6,651,202 B1 | 11/2003 | Phan | |
| 6,856,569 B2 | 2/2005 | Nelson et al. | |
| 7,003,622 B2 * | 2/2006 | Shinohara et al. | 711/104 |
| 7,174,486 B2 | 2/2007 | Adams et al. | |
| 7,251,756 B2 | 7/2007 | Anand et al. | |
| 7,308,598 B2 | 12/2007 | Beattie et al. | |
| 7,627,792 B2 * | 12/2009 | Di Ronza et al. | 714/710 |
| 2002/0101777 A1 | 8/2002 | Anand et al. | |
| 2006/0294440 A1 | 12/2006 | Riley | |

* cited by examiner

*Primary Examiner*—Son Dinh
*Assistant Examiner*—Nam Nguyen
(74) *Attorney, Agent, or Firm*—Klein, O'Neill & Singh, LLP

(57) ABSTRACT

Structures for fuses to control repair of multiple memories embedded on an integrated circuit are provided along with methods of use. A set of fuses is shared to control repair of a plurality of memories. Some of the fuses are associated with a memory to be repaired. Others of the fuses identify how the repair is accomplished.

26 Claims, 5 Drawing Sheets

FUSES FOR MEMORY REPAIR

BACKGROUND OF THE INVENTION

The present invention relates generally to repair of integrated circuit memory and more particularly to using one set of fuses to control repair of multiple memories.

During the fabrication of an integrated circuit, defects may occur and render a circuit inoperable. Larger circuits and those with higher utilization of area are increasingly susceptible to defects. Memories embedded in integrated circuits are often large and dense. To achieve satisfactory manufacturing yield, memories may need to be designed to have reduced susceptibility to defects. Often this is accomplished by including spare or redundant sections into the memory. A defect in one section of the memory may be effectively eliminated by using the redundant section instead.

Some integrated circuits contain many individual memory modules. This commonly occurs when the integrated circuit is designed for communication system applications. Multiple memories may also occur in system-on-a-chip type integrated circuits. It may be impractical to share redundant memory sections between memory modules. Thus, each memory module will generally have its own redundant section.

Determination of when to use a redundant memory section is often controlled by fuses programmed during manufacturing of the integrated circuit. A fuse is generally physically large. Large size, however, is generally undesirable in an integrated circuit because of the associated reduction in performance and increase in cost. In an integrated circuit with many memory modules, the area required for fuses to control redundancy for each memory module may inhibit use of redundancy.

BRIEF SUMMARY OF THE INVENTION

The present invention provides for memory repair. In one aspect the invention provides An integrated circuit, comprising: a plurality of memories with a redundant section; a first set of permanent storage devices to identify a memory, and a second set of permanent storage devices to specify use of the redundant section by the memory identified by the first set of permanent storage devices.

In another aspect the invention provides an integrated circuit, comprising: a plurality of memories each with a redundant section; a first plurality of sets of permanent storage devices, one associated with each of the plurality of memories, storing data to conditionally enable use of the redundant section of the associated memory; circuitry sensing data programmed into the first sets of permanent storage devices to generate memory repair enable signals; a second plurality of sets of permanent storage devices, each specifying a redundancy utilization; circuitry sensing data programmed into the second sets of permanent storage devices to generate repair control signals; and multiplexers selecting one of the repair control signals based on the repair enable signals.

In another aspect the invention provides a process for programming fuses for repair of integrated circuit memories, comprising: testing memories in an integrated circuit; identifying a faulty memory; identifying a repair for the faulty memory; programming permanent storage devices on the integrated circuit to signal the identified faulty memory; and programming permanent storage devices on the integrated circuit to signal the identified repair.

In another aspect the invention provides a process for repair of memories embedded in an integrated circuit, comprising: testing memories in an integrated circuit; identifying a faulty memory; identifying a repair for the faulty memory; programming a first set of permanent storage devices on the integrated circuit to signal the identified faulty memory; programming a second set of permanent storage devices on the integrated circuit to signal the identified repair; sensing the status programmed into the permanent storage devices; identifying a memory for repair from the sensed status; and repairing the identified memory based on the sensed status.

These and other aspects of the invention are more fully comprehended upon review of this disclosure.

DETAILED DESCRIPTION

Figure 1:
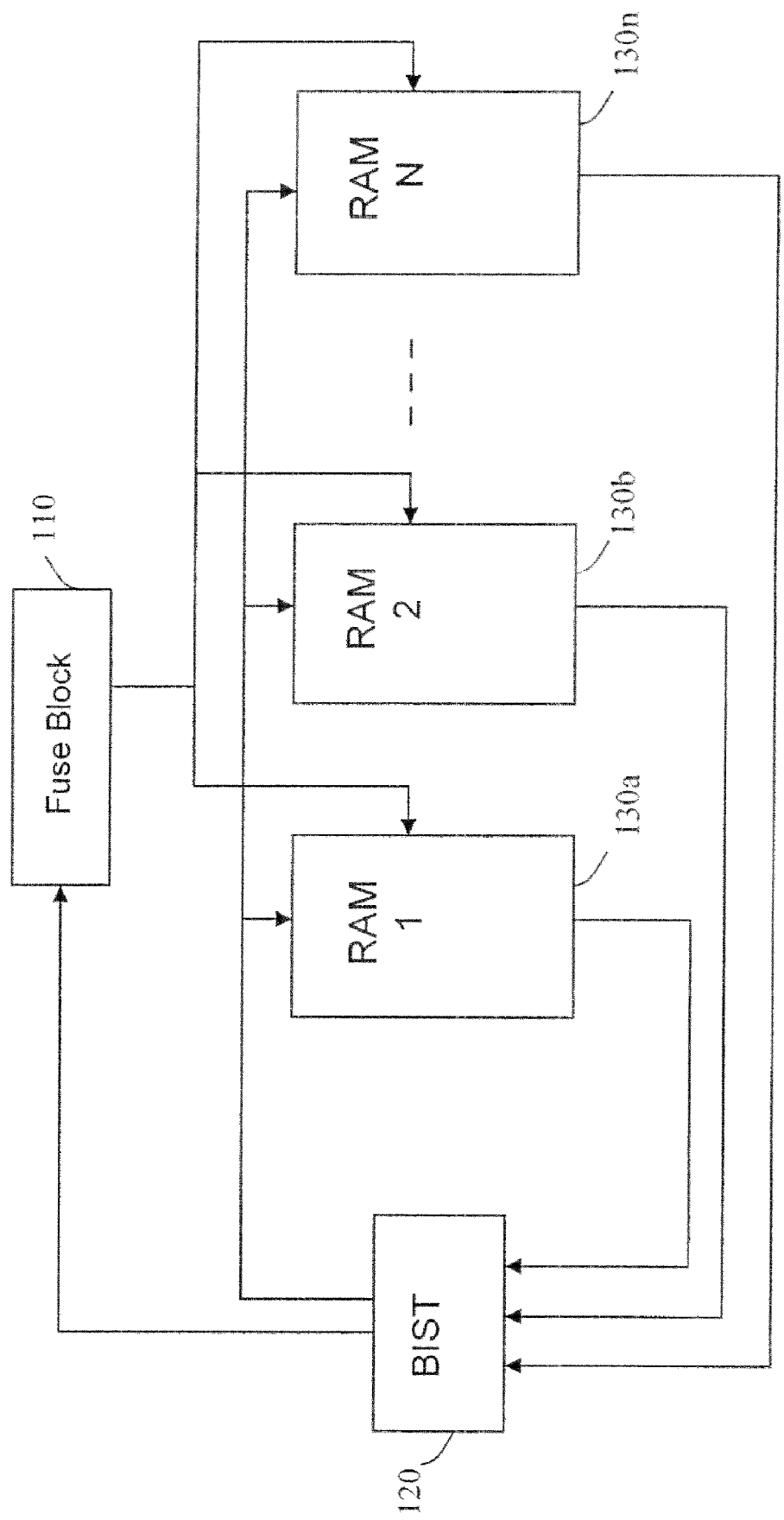
FIG. 1 is a block diagram of memories and fuses in an integrated circuit in accordance with aspects of the invention.

FIG. 1 is a block diagram of an integrated circuit (IC) with embedded, repairable memories. The IC may, for example, perform functions for a communication system. The IC includes multiple memories, built-in self test circuitry, and fuses. Often, the IC will include other circuits, for example, logic modules, adders, multipliers, and sequencers.

As shown in FIG. 1, the IC contains multiple random access memories (RAM) $130a$-$130n$. The RAMs typically store data for use by other circuitry on the IC. Often a RAM is static (SRAM) but could be dynamic (DRAM). Alternatively, a RAM block could be an electrically erasable programmable read-only memory, a register file, a first-in first-out memory, a stack, a logic array, or another arrayed structure.

Each RAM is organized into a large number of rows and columns of bit cells. A desired row and column are addressed to provide access to a desired memory bit. A manufacturing defect in any bit cell or in the circuitry controlling access to the rows and columns could render a RAM inoperable. This would generally render the entire IC unusable at substantial loss to its manufacturer. To reduce this type of loss, ability to repair a defective memory is included in the form of redundant or spare bit cells. The spare bits cells are often provided by inclusion of a spare column. Spare rows may alternatively or additionally be included. Other organizations of spare cells could be used depending upon the physical and electrical organization of the memory.

Spare memory cells provide repair for defective memory cells by replacement. Replacement is accomplished by accessing the spare cells instead of a defective cell. That is, when access to a defective cell is requested, the RAM accesses a spare cell instead.

As shown in FIG. 1, a fuse block 110 supplies control signals to each RAM. The control signals signal the locations of defective memory bits so that spare cells can be use to replace defective cells. The fuse block contains multiple fuses. The fuses are programmed to indicate the location of defective cells. For example, the fuses could provide a binary representation of a RAM column that should be replaced with a spare column.

The fuses are often electrical fuses. That is, they are small conductors that are programmed by blowing the fuse by subjecting it a large current. Thus, the fuse starts as relatively low resistance circuit, but after programming it is a relatively high resistance or open circuit. Other embodiments implement optical fuses, which are small conductors cut open with a laser. Alternatively, the fuse block could contain antifuses, programmable read only memory cells, or other circuitry capable of permanent storage. In some embodiments, multiple fuse blocks may exist with each fuse block connected to a set of memory modules.

To replace defective cells, their location preferably should be known. The IC includes a built in self test (BIST) block 120 interconnected with each RAM and the fuse block. BIST is used in the IC manufacturing process to apply a sequence of stimuli to a RAM and analyze signals the RAM generates in response. If the RAM generates an unexpected response, it is defective and the BIST block can determine which memory cells need replacement. In various embodiments, the BIST function could also be performed with automated test equipment (ATE) external to the IC or combination of ATE and BIST. Data indicating replacement is programmed into the fuses during manufacturing and the programmed data is supplied to the RAMs during operation of the IC.

Figure 2:
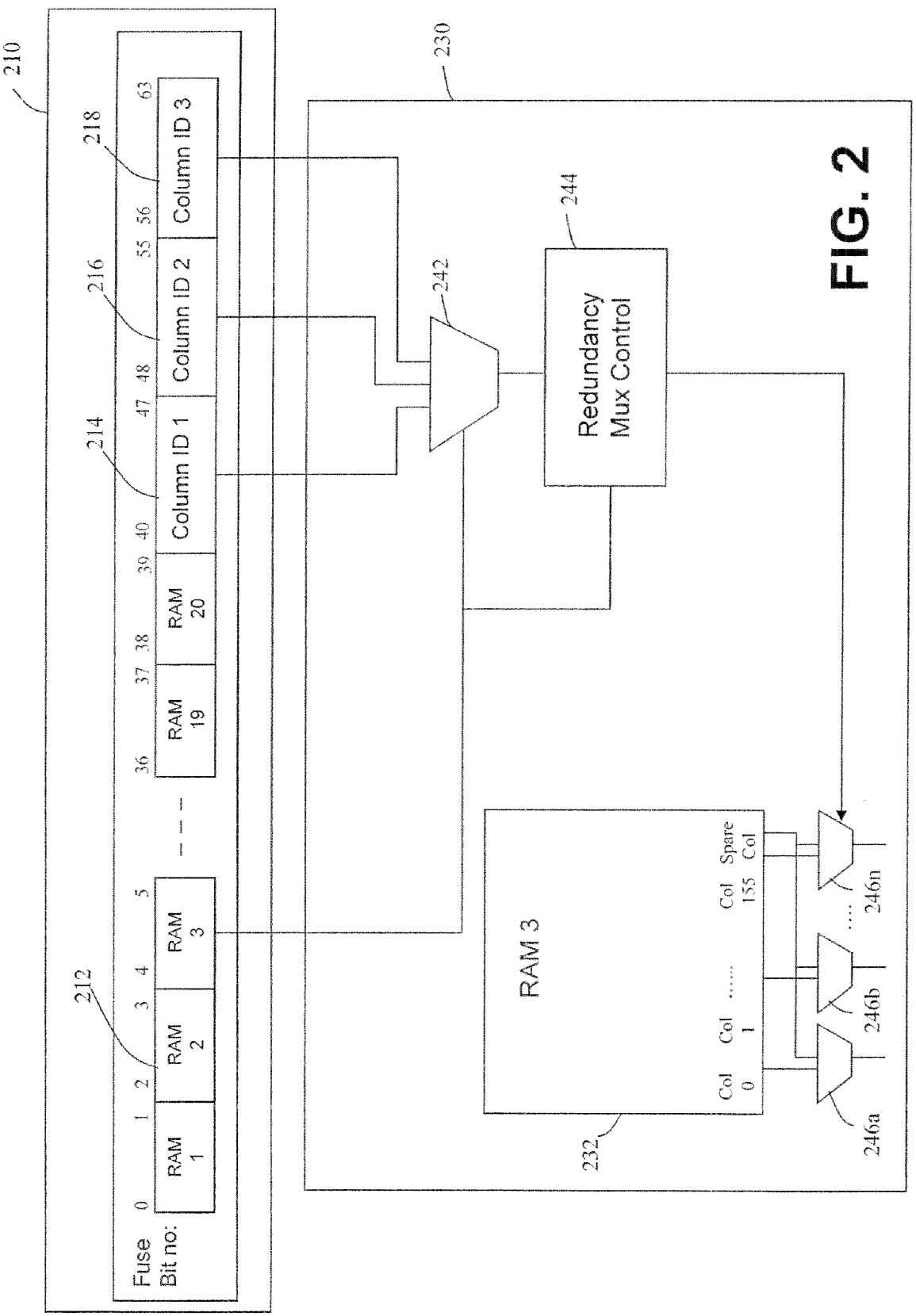
FIG. 2 is a diagram of a RAM block and fuse block in accordance with aspects of the invention.

FIG. 2 shows details of an embodiment of fuses and redundancy for a RAM. This example is for an IC that contains twenty RAMs, any three of which are repairable by replacing one of 256 columns. FIG. 2 shows a third numbered RAM module 230. The RAM module receives redundancy control signals from a fuse block 210.

In the example of FIG. 2, the fuse block 210 contains 64 fuses that control RAM repair in the IC. The fuses are shown in FIG. 2 logically arranged as a register with the fuses numbered from 0, on the left, to 63, on the right. Each fuse stores one of two types of information. Some fuses identify which column in a RAM to replace with a spare column. The other fuses are associated with a specific RAM and signal if the RAM needs repair and, if so, which column identifier fuses signal how the repair is to be done.

FIG. 2 shows three sets of column identifier fuses: column ID #1 214 at positions 40-47, column ID #2 216 at positions 48-55, and column ID #3 218 at positions 56-63. The binary code programmed in a set of column identifier fuses specifies which column in a RAM will be replaced with a spare column. Although column identifiers in FIG. 2 contain eight fuses, the number of fuses is generally chosen to match the IC's RAM redundancy. An embodiment with RAMs of varying sizes might use column identifiers that also vary in size. The number of column identifiers limits the number of RAM defects that can be repaired in an IC. Although three column identifiers are shown, an embodiment may use a different number based, in part, on the number of embedded RAMs and the likelihood of RAM defects.

FIG. 2 also shows a set of two fuses 212 at positions 4 and 5 signaling the repair select for RAM #3. If the fuses are both zero. RAM #3 does not require repair. Non-zero values in the fuses signal which column identifier fuses signal the repair for RAM #3. Other pairs of fuses signal the corresponding repair information for other RAMs. Generally the number of fuses for each RAM repair select will correspond to the number of column identifiers. That is, a binary weighted interpretation of each set of repair select fuses can signal no repair or repair using any one of the column identifiers. Other embodiments may reduce the number of fuses in the repair select for a RAM by restricting repair for that RAM to a subset of the available column identifier fuses.

Also shown in FIG. 2 is a RAM module 230 that includes a memory array 232 with 257 columns, 256 operationally required columns and one spare column. The RAM module has redundancy multiplexers 246a-246n to switch in the spare RAM column when required. Each multiplexer selects between one of the operationally required columns and the spare column. At most, one of the multiplexers selects the spare column. The multiplexers are controlled by a redundancy multiplexer control block 244 that decodes signals from the fuse block into control signals for the redundancy multiplexers. If the RAM repair select signal from the fuse block is non-zero, a selected column identifier is decoded to enable the spare column onto the identified column. Otherwise, the spare column is not used. The redundancy multiplexer control block receives the selected column identifier from a multiplexer 242. The multiplexer selects between three column identifiers supplied by the fuse block. The selection is determined by the RAM repair select signals.

Figure 3:
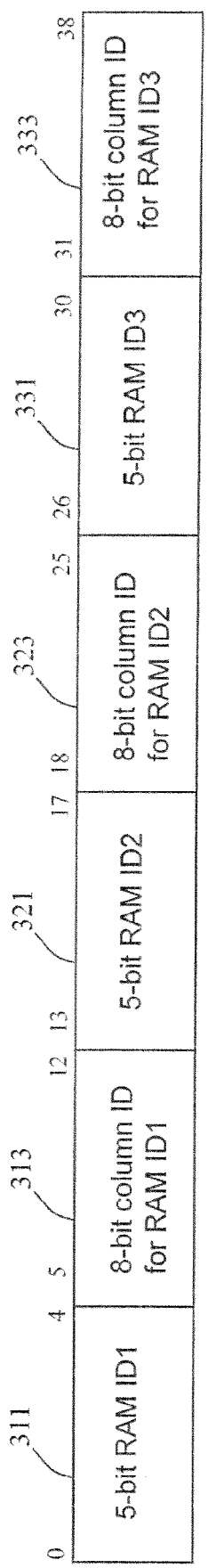
FIG. 3 is a diagram of a fuse organization in accordance with aspects of the invention.

An alternative definition of fuses for repair of multiple RAMs within an IC is shown in FIG. 3. The assignment of fuses is shown as allocation in a register. At the leftmost position are five fuses defining a first RAM identifier 311. To the right of this are eight fuses defining a first column identifier 313. This is followed by a second RAM identifier 321, a second column identifier 323, a third RAM identifier 331, and a third column identifier 333.

Each RAM identifier functions in tandem with its associated column identifier. The RAM identifier specifies a RAM in the IC that needs repair. The associated column identifier specifies which column in the RAM needs repair. For example, the fuses of the first RAM identifier might be programmed to signal the binary string 0,0,1,0,1 and the fuses of the first column identifier might be programmed to signal the binary string 0,0,0,1,1,0,0,1. This would signal that RAM number 5 needs repair and that a spare column in RAM number 5 should replace column number 25.

Generally, an unprogrammed fuse will be interpreted to signal logic zero value. It may then be advantageous for the IC to not designate a RAM as number zero so that unprogrammed RAM identifier fuses signal no repair.

Although the embodiment shown in FIG. 3 uses five fuses for each of three RAM identifiers and eight fuses for each of three column identifiers, the number of identifiers and the number of fuses in each identifier may all be varied in a manner analogous to that described above for the embodiment shown in FIG. 2.

Figure 4:
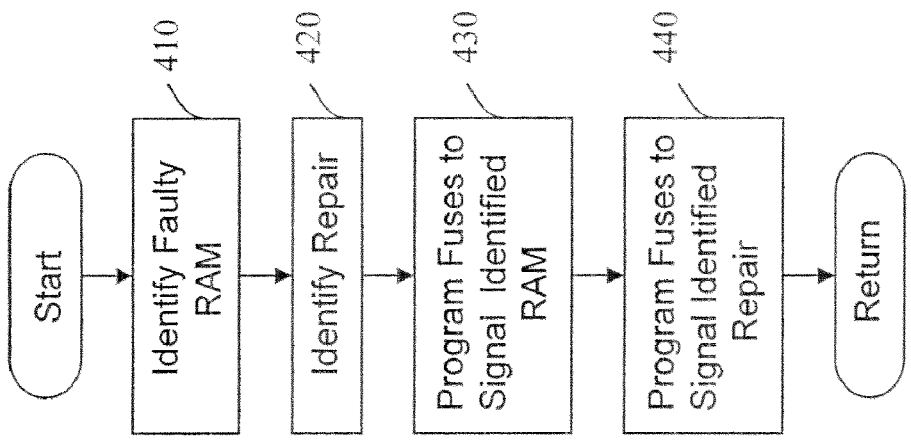
FIG. 4 is a flow diagram of a process for programming fuses in accordance with aspects of the invention.

FIG. 4 is a flowchart of a process for programming integrated circuit fuses for repair of memories. In some embodiments, the process is performed by automated test equipment used in manufacturing an IC. In other embodiments, an integrated circuit contains built-in self test circuitry that performs the process. In block 410, the process identifies a faulty RAM. Often this is done by writing preestablished values into a RAM and checking that the same values return when read from the RAM. In block 420, the process identifies the repair needed to fix the RAM identified as faulty. In some embodiments, the required repair is identified by determining in which columns the RAM does not return the same value on a read that was previously written. In other embodiments, a signature analysis of data returned from the RAM is used to identify the repair needed.

In block 430, the process programs fuses to signal the RAM identified for repair. In many embodiments, automatic test equipment programs fuses by blowing open electrical fuses to signal a logical one and leaving the fuse intact to signal a logical zero. The identification of the RAM could be provided, for example, as with fuses 212 of FIG. 2 or as with fuses 311 of FIG. 3. In block 440, the process programs fuses to signal the identified repair. In most embodiments, the fuses will be programmed by the same physical method used to program fuses in block 430. The identification of the repair could be provided, for example, as with fuses 214 of FIG. 2 or as with fuses 313 of FIG. 3. The process thereafter returns.

Figure 5:
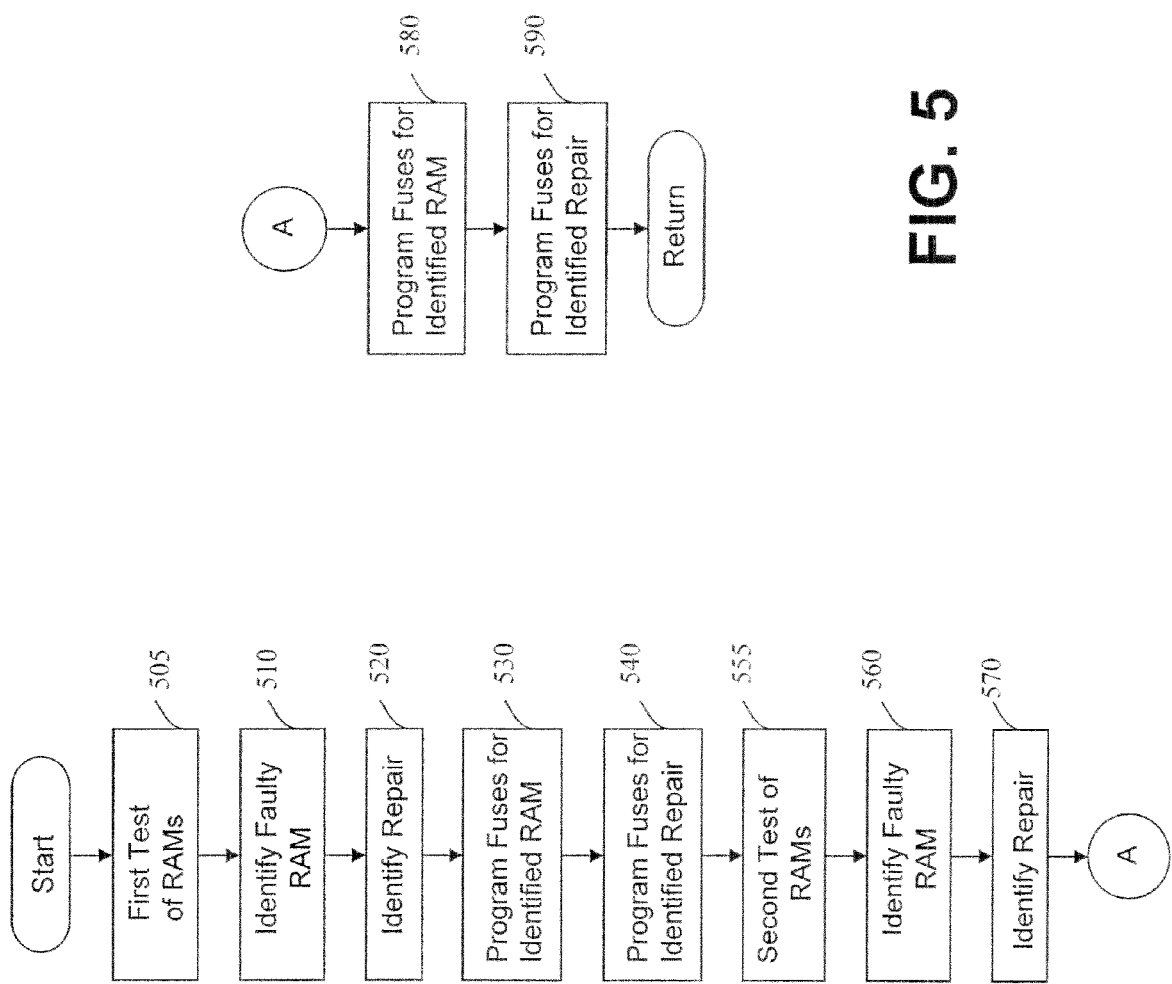
FIG. 5 is a flow diagram of a further process for programming fuses in accordance with aspects of the invention.

FIG. 5 is a flowchart of a further process for programming integrated circuit fuses for repair of memories. Note that the process is similar to the process shown in FIG. 4. In many embodiments, automated test equipment performs the process. In other embodiments, built in self test circuitry integrated into an IC performs the process. In block 505, the process tests RAMs on in integrated circuit. This step may be performed during probe testing of a wafer of ICs. In block 510, the process identifies a faulty RAM. In block 520, the process identifies the repair needed to fix the RAM identified as faulty. In block 530, the process programs fuses to signal the RAM identified for repair. In block 540, the process programs fuses to signal the identified repair. Blocks 510, 520, 530, and 540 correspond to blocks 410, 420, 430, and 440, respectively, of the process shown in FIG. 4.

In block 555, the process tests RAMs for a second time. This test is similar to the test of block 505; however, test 555 may be more or less thorough than the first test and may be performed under different conditions, for example, at a higher temperature. In many embodiments of the process, this test is performed on packaged ICs. In block 560, the process identifies a faulty RAM. In block 570, the process identifies the repair needed to fix the RAM identified as faulty. In block 580, the process programs fuses to signal the RAM identified for repair. In block 590, the process programs fuses to signal the identified repair. Blocks 560, 570, 580, and 590 are analogous to blocks 510, 520, 530, and 540, respectively. However, identification of faulty RAMs and their repair will generally be done after any repairs programmed in blocks 530 and 540 are applied. Additionally, programming fuses in blocks 580 and 590 is performed incrementally to programming perform in blocks 530 and 540. For example, using the fuse definitions shown in FIG. 3, if the first RAM identifier 311 was programmed in block 530, fuse programming in block 580 starts with the second RAM identifier 321 and fuse programming in block 590 starts with the second column identifier 323. The physical method used to program fuses in blocks 580 and 590 will generally be the same as used in blocks 530 and 540. The methods could differ, for example, with programming performed by laser cutting in blocks 530 and 540 but by electrical programming in blocks 580 and 590. The process thereafter returns.

The foregoing description of embodiments of the invention has been presented for purposes of illustration and description. It is not intended to be exhaustive or to limit the invention to the precise form disclosed, and modifications and variations are possible in light of the above teachings or may be acquired from practice of the invention. Accordingly, it should be realized that the invention may be practiced other than as specifically described, the invention comprising the novel and unobvious claims and their insubstantial variations supported by this disclosure.

What is claimed is:

1. An integrated circuit, comprising:
a plurality of memories each with a redundant section;
a first set of permanent storage devices to identify one of the plurality of memories, and
a second set of permanent storage devices to specify use of the redundant section of the memory identified by the first set of permanent storage devices.

2. The integrated circuit of claim 1, wherein the first set of permanent storage devices and the second set of permanent storage devices are fuses.

3. The integrated circuit of claim 2, wherein the fuses are electrical fuses.

4. The integrated circuit of claim 3, wherein the plurality of memories comprises a plurality of static random access memories.

5. The integrated circuit of claim 1, wherein the first set of permanent storage devices and the second set of permanent storage devices are antifuses.

6. The integrated circuit of claim 1, wherein the plurality of memories comprises a random access memory.

7. The integrated circuit of claim 6, wherein the random access memory is static random access memory.

8. The integrated circuit of claim 6, wherein the random access memory is dynamic random access memory.

9. The integrated circuit of claim 1, further comprising built-in self test circuitry operatively coupled to at least one of the plurality of memories, to the first set of permanent storage devices, and to the second set of permanent storage devices.

10. The integrated circuit of claim 1, wherein the redundant section comprises a spare column and the second set of permanent storage devices specifies column replacement.

11. The integrated circuit of claim 1, wherein the redundant section comprises a spare row and the second set of permanent storage devices specifies row replacement.

12. An integrated circuit, comprising:
a plurality of memories each with a redundant section;
a first plurality of sets of permanent storage devices, one associated with each of the plurality of memories, storing data to conditionally enable use of the redundant section of the associated memory;
circuitry sensing data programmed into the first sets of permanent storage devices to generate memory repair enable signals;
a second plurality of sets of permanent storage devices, each specifying a redundancy utilization;
circuitry sensing data programmed into the second sets of permanent storage devices to generate repair control signals; and
multiplexers selecting one of the repair control signals based on the repair enable signals.

13. The integrated circuit of claim 12, wherein the first set of permanent storage devices and the second set of permanent storage devices are fuses.

14. The integrated circuit of claim 13, wherein the fuses are electrical fuses.

15. The integrated circuit of claim 14, wherein the plurality of memories comprises a plurality of static random access memories.

16. The integrated circuit of claim 12, wherein the first set of permanent storage devices and the second set of permanent storage devices are antifuses.

17. The integrated circuit of claim 12, wherein the plurality of memories comprises a random access memory.

18. The integrated circuit of claim 17, wherein the random access memory is static random access memory.

19. The integrated circuit of claim 17, wherein the random access memory is dynamic random access memory.

20. The integrated circuit of claim 12, further comprising built-in self test circuitry operatively coupled to at least one of the plurality of memories, to the first sets of permanent storage devices, and to the second sets of permanent storage devices.

21. The integrated circuit of claim 12, wherein the redundant section comprises a spare column and the second set of permanent storage devices specifies column replacement.

22. The integrated circuit of claim 12, wherein the redundant section comprises a spare row and the second set of permanent storage devices specifies row replacement.

23. A process for programming fuses for repair of integrated circuit memories, comprising:
- testing memories in an integrated circuit;
- identifying a faulty memory;
- identifying a repair for the faulty memory;
- programming first permanent storage devices on the integrated circuit to signal the identified faulty memory; and
- programming second permanent storage devices on the integrated circuit to signal the identified repair for the faulty memory.

24. The process of claim 23, further comprising:
- a second testing of memories in the integrated circuit;
- a second identifying of a faulty memory;
- a second identifying of a repair for the faulty memory;
- a second programming of permanent storage devices on the integrated circuit to signal the identified faulty memory; and
- a second programming of permanent storage devices on the integrated circuit to signal the identified repair.

25. The process of claim 24, wherein the testing memories on an integrated circuit is performed on a wafer of integrated circuits and the second testing of memories on the integrated circuit is performed after packaging the integrated circuit.

26. A process for repair of memories embedded in an integrated circuit, comprising:
- testing memories in an integrated circuit;
- identifying a faulty memory;
- identifying a repair for the faulty memory;
- programming a first set of permanent storage devices on the integrated circuit to signal the identified faulty memory;
- programming a second set of permanent storage devices on the integrated circuit to signal the identified repair;
- sensing the status programmed into the permanent storage devices;
- identifying a memory for repair from the sensed status; and
- repairing the identified memory based on the sensed status.

* * * * *